(12) United States Patent
Mani

(10) Patent No.: US 12,069,789 B2
(45) Date of Patent: *Aug. 20, 2024

(54) TOOL FOR ANNEALING OF MAGNETIC STACKS

(71) Applicant: III Holdings 1, LLC, Wilmington, DE (US)

(72) Inventor: Krishnakumar Mani, San Jose, CA (US)

(73) Assignee: III Holdings 1, LLC, Wilmington, DE (US)

( * ) Notice: Subject to any disclaimer, the term of this patent is extended or adjusted under 35 U.S.C. 154(b) by 357 days.

This patent is subject to a terminal disclaimer.

(21) Appl. No.: 17/492,289

(22) Filed: Oct. 1, 2021

(65) Prior Publication Data

US 2022/0104316 A1 Mar. 31, 2022

Related U.S. Application Data

(63) Continuation of application No. 16/989,565, filed on Aug. 10, 2020, now Pat. No. 11,166,348, which is a continuation of application No. 15/625,549, filed on Jun. 16, 2017, now Pat. No. 10,779,363, which is a continuation of application No. 13/424,337, filed on Mar. 19, 2012, now Pat. No. 9,713,203.

(51) Int. Cl.
*H05B 6/10* (2006.01)
*H01L 21/67* (2006.01)

(52) U.S. Cl.
CPC ......... *H05B 6/10* (2013.01); *H01L 21/67109* (2013.01); *H01L 21/6719* (2013.01)

(58) Field of Classification Search
CPC ........ H05B 6/10; H05B 6/6411; H05B 6/645; H05B 6/806; H05B 6/80; H01L 21/67103; H01L 21/67109; H01L 21/67115; H01L 21/6719; C23C 16/4411; C23C 16/46; C23C 16/466
USPC ............ 219/601, 635, 638, 652, 390, 441.1, 219/443.1, 438, 465.1, 544, 545; 118/623, 639, 723 ER, 724, 725; 117/32, 117/34, 51, 917
See application file for complete search history.

(56) References Cited

U.S. PATENT DOCUMENTS

| | | |
|---|---|---|
| 5,647,945 A | 7/1997 | Matsuse et al. |
| 6,002,109 A | 12/1999 | Johnsgard et al. |
| 6,278,089 B1 | 8/2001 | Young et al. |
| 6,303,906 B1 | 10/2001 | Yoo |
| 6,455,815 B1 | 9/2002 | Melgaard et al. |
| 7,264,768 B2 | 9/2007 | Tuttle et al. |
| 8,837,924 B2 | 9/2014 | Tsunekawa et al. |
| 2003/0230385 A1 | 12/2003 | Bach et al. |
| 2005/0087519 A1 | 4/2005 | Klostermann et al. |

(Continued)

*Primary Examiner* — Hung D Nguyen
(74) *Attorney, Agent, or Firm* — Volpe Koenig

(57) ABSTRACT

In one embodiment of the invention, there is provided a tool for annealing a magnetic stack. The tool includes a housing defining a heating chamber; a holding mechanism to hold at least one wafer in a single line within the heating chamber, a heating mechanism to heat the at least one wafer; and a magnetic field generator to generate a magnetic field whole field lines pass through the single line of wafers during a magnetic annealing process; wherein the holding mechanism comprises a wafer support of holding the single line of wafers between the heating mechanism and the magnetic field generator.

12 Claims, 7 Drawing Sheets

(56) References Cited

U.S. PATENT DOCUMENTS

| | | |
|---|---|---|
| 2006/0096976 A1 | 5/2006 | Iwaki |
| 2008/0087839 A1 | 4/2008 | Dorai |
| 2008/0151596 A1 | 6/2008 | Fontana, Jr. et al. |
| 2009/0133838 A1 | 5/2009 | Miyagawa |
| 2010/0101495 A1 | 4/2010 | Emerson et al. |
| 2013/0199730 A1* | 8/2013 | Gudeman ......... H01L 21/67109 156/379.6 |

* cited by examiner

FIG. 4A

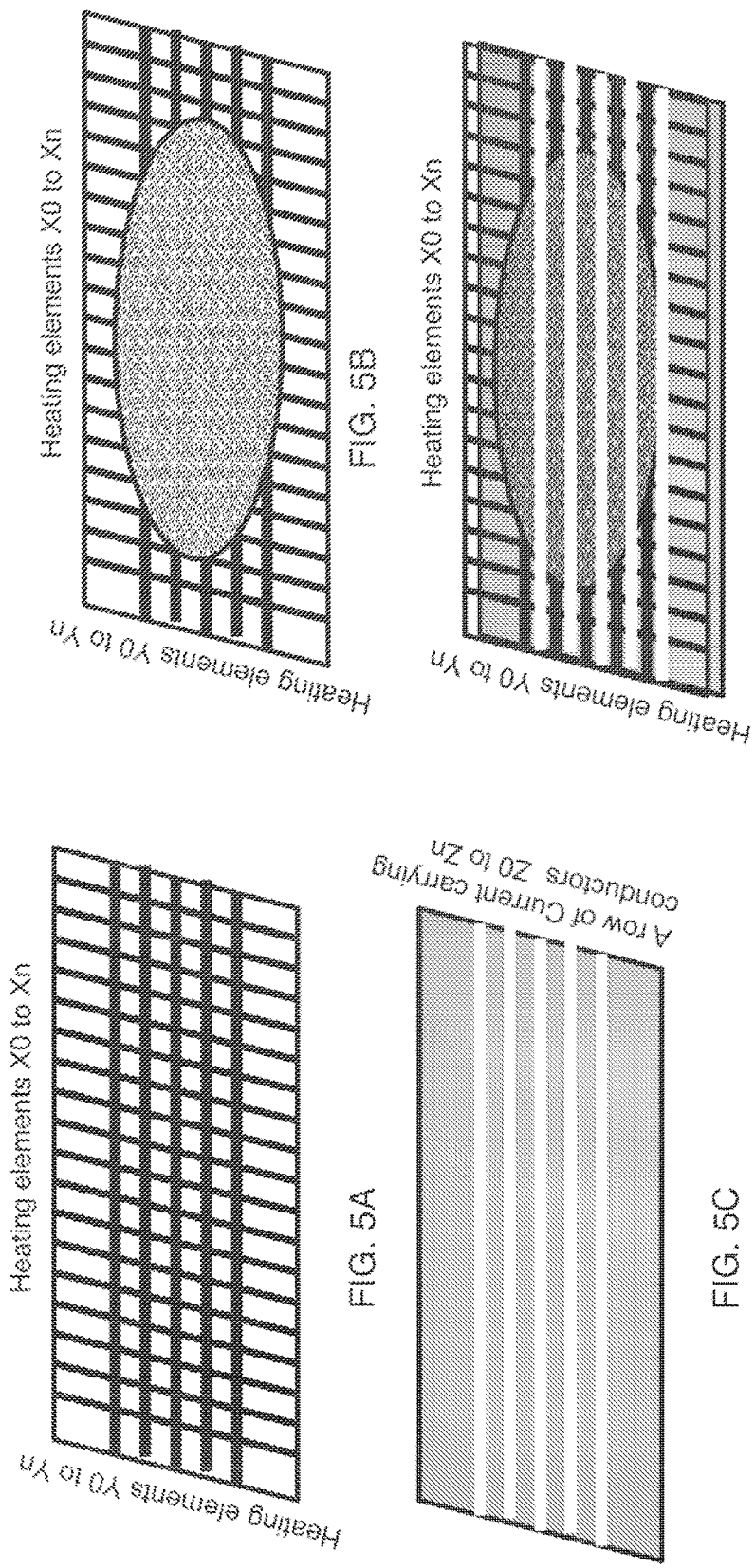

TOOL FOR ANNEALING OF MAGNETIC STACKS

CROSS REFERENCE TO RELATED APPLICATIONS

This application is a continuation of U.S. patent application Ser. No. 16/989,565, filed Aug. 10, 2020, which is a continuation of U.S. patent application Ser. No. 15/625,549, filed Jun. 16, 2017, issued on Sep. 15, 2020 as U.S. Pat. No. 10,779,363, which is a continuation of U.S. patent application Ser. No. 13/424,337, filed on Mar. 19, 2012, issued on Jul. 18, 2017 as U.S. Pat. No. 9,713,203, which are incorporated by reference as if fully set forth.

FIELD OF INVENTION

Embodiments of the invention relate to the annealing of magnetic stacks.

BACKGROUND

Magnetic film stacks are used in a variety of devices including Magnetic Random Access Memory (MRAM) devices. During manufacture, the magnetic film stacks are annealed in a thermal processor in order to achieve desired material properties.

FIG. 1 shows a prior art system 100 used for magnetic annealing of magnetic film stacks. The system 100 includes an annealing chamber 102 which is surrounded by a magnetic field generation component 104. The magnetic field generation component 104 may comprise a giant cylinder of ferromagnetic materials with coils to pass current therethrough in order to generate a magnetic field.

Heating elements 106 are located on the periphery of the heating chamber 102 to supply heat to heating chamber 102 during the thermal annealing process.

In use a plurality of wafers/substrates 108 with magnetic stacks for annealing are carried by a wafer carrier 110. The wafer carrier 110 is then placed in the annealing chamber 102 as indicated. The process of magnetic annealing includes heating the annealing chamber 102 to a temperature of between 200 to 600 degrees Celsius for anywhere between 30 minutes to 2 hours. The process may be carried out in a vacuum. Alternatively, the annealing chamber may be filled with a gas such as hydrogen, helium, argon, etc.

Current flowing through the magnetic field generation component 104 in the direction of the arrows 112 cause a magnetic field of between 1 to 5 Teslas to be induced within the annealing chamber 102.

The aforementioned magnetic annealing process suffer from the following disadvantages:

Conflicting requirements: For the best film crystallographic qualities large amounts of thermal energies are required to be supplied for a relatively long time (30 minutes to 2 hours. As a result some of the magnetic materials can start diffusing or moving thereby compromising device performance due to junction deterioration.

Long annealing times and higher temperatures affect the performance of the prefabricated silicon integrated circuits to which the magnetic stacks are integrated in a backend process.

The number of wafers that can be annealed per hour is small due to long annealing times.

Device performance may be compromised by reducing the annealing temperature and time to accommodate for the above problems. Long annealing times and higher temperatures affect the performance of the prefabricated silicon integrated circuits to which the magnetic stacks are integrated in a backend process.

The number of wafers that can be annealed per hour is small due to long annealing times.

Device performance may be compromised by reducing the annealing temperature and time to accommodate for the above problems.

The magnetic field is supplied by huge electromagnets that are very expensive and difficult to maintain. Complicated cooling systems are needed to keep the electromagnets cold. This increases the cost of manufacturing the magnetic film stacks.

The wafers are annealed as a batch of 25 or 50 and local thermal variations on a wafer are difficult to control; thermal radiation between each wafer further increases the temperature variations and hence the magnetic device performance.

Thermal variations are further aggravated by the gas flow dynamics if the wafers are annealed in gas ambience as the gas flow between the batch of wafers is not predictable and are subject to variations.

SUMMARY

In accordance with a first aspect of the invention, there is provided a tool for annealing a magnetic stack. The tool includes a housing defining a heating chamber; a holding mechanism to hold at least one wafer in a single line within the heating chamber, a heating mechanism to heat the at least one wafer; and a magnetic field generator to generate a magnetic field whose field lines pass through the single line of wafers during a magnetic annealing process; wherein the holding mechanism comprises a wafer support of holding the single line of wafers between the heating mechanism and the magnetic field generator.

In accordance a first aspect of the invention, there is provided a method for retrofitting a rapid thermal processor with a grid of current carrying conductors to generate a magnetic field for annealing a single line of wafers.

Other aspects of the invention will become apparent from the written description below.

BRIEF DESCRIPTION OF THE DRAWINGS

FIGS. 4A and 4B show cross-sectional view of tools of annealing magnetic stacks in accordance with embodiments of the invention.

FIG. 5A-5D shows the heating grid and the magnetic field generator of the tool, In greater detail.

DETAILED DESCRIPTION OF THE PREFERRED EMBODIMENTS

In the following description, for purposes of explanation, numerous specific details are set forth in order to provide a thorough understanding of the invention. It will be apparent, however, to one skilled in the art that the invention can be practiced without these specific details.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Figure 3:
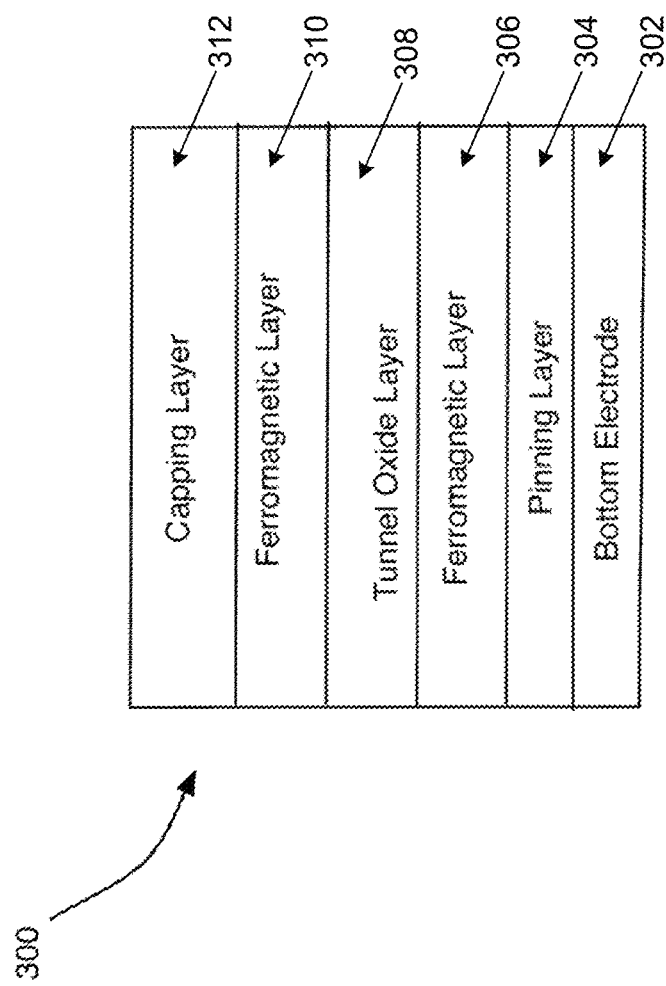
FIG. 3 shows a cross-sectional view of a magnetic stack that is annealed in accordance with embodiments of the invention.

Referring now to FIG. 3 of the drawings, there is shown a cross-section through a magnetic stack 300 that may be annealed in accordance with the systems and methods disclosed herein. As will be seen, the stack 300 comprises a bottom electrode layer 302 The bottom electrode layer may comprise materials such as tantalum, rubidium, copper, copper-nitride. A pinning layer 304 overlies the bottom electrode layer 302 and comprises materials such as platinum-manganese, or iridium manganese. Layer 306 resides atop layer 304 and comprises a ferromagnetic material such as iron-cobalt, or nickel-iron. The magnetic stack 300 comprises a tunnel dielectric layer 308 that resides on the layer 304. The tunnel dielectric layer 308 may comprise a material such as magnesium oxide. The stack 300 is completed by a ferromagnetic layer 310 of, e.g. iron cobalt, and a capping layer 312 of e.g. ruthenium or tantalum.

The magnetic stack 300 may be used to define magnetic bits in a MRAM memory device. For device performance, the magnetic domains in the pinning layer 304 must be aligned. This is achieved by a magnetic annealing process. Moreover, the tunnel dielectric layer 308 must be thermally annealed to change its material propertied from amorphous to crystalline.

Advantageously, in one embodiment, there is provided a method for annealing magnetic stacks in which processes of thermal annealing and magnetic annealing are carried out in the same equipment and in the same process.

Referring now to S4A and 4B of the drawings, there is shown a cross-sectional view of a magnetic annealing tool 400 and a magnetic annealing tool 400', according to embodiments of the present invention. Chamber walls 402 form an outer port 404 through which a semiconductor substrate, such as wafer 406 comprising a magnetic stack, may be introduced into the tool 400. A conventional load lock mechanism may be used for inserting and removing wafer 406 through outer port 404. After the wafer has been loaded into tool 400, a plate 407 is used to cover outer port 404. In addition, a viewing window 405 may be provided for, among other things, end point detection, in situ process monitoring and wafer top surface temperature measurement. If a window is used for these purposes, a small hole or clear section must be provided through any internal chamber surfaces, such as insulating walls, to allow the wafer to be viewed. When a window is not used, a non-transmissive plate may be used to cover the viewing port for improved insulation.

Chamber walls 402 are relatively cold, preferably being maintained at an average temperature less than one hundred degrees Celsius (100° C.). Chamber walls 402 are aluminum and are cooled by cooling channels 408. Water or another cooling media may be pumped through cooling channels 408 to cool the aluminum chamber walls 402.

After the wafer is introduced into the chamber, it is placed upon narrow pins 410 which may comprise silicon carbide or ceramic. The pins are mounted on a pin support plate 412 that may be raised and lowered by an elevational mechanism 414, such as a pneumatic or electromechanical lift with a vacuum-sealed bellows. After the wafer is loaded into the chamber and placed on pins 410, the elevational mechanism 414 is lowered to place wafer 406 close to or onto a heated block 416 for thermal processing.

The heated block preferably has a large thermal mass that provides a stable and repeatable heat source for heating wafer 406. Heated block 416 may provide a heating surface 418 within the chamber that is substantially parallel to the wafer to allow heat transfer across the entire backside surface area of the wafer. Heated block 416 comprises a material that will not contaminate wafer 405 even when the wafer is placed in contact with the heated block 416 at high temperatures (greater than 500° C.) and low pressures (less than 100 Torr). In one embodiment, heated block 416 comprises silicon carbide coated graphite, although other materials that will not react with the wafer at processing temperatures such as silicon carbide or quartz may be used as well. A material with high thermal conductivity is preferred to allow heat to uniformly dissipate through the block. Insulating techniques described below are used to prevent sharp temperature gradients from forming in the heated block 416 due to heat losses at the edges of the heated block 416.

In one embodiment, the heated block 416 is approximately one (1) inch thick in the first embodiment and provides a thermal mass substantially larger than the wafer which is only about thirty five thousandths (0.035) of an inch thick. It is preferred that heated block 416 be at least ten times thicker than the wafer that is being processed. This provides a stable temperature heat source for thermally processing wafer 406.

In one embodiment, a single heated block 416 provides a generally rectangular heating surface large enough to process two wafers 406 at a time. Using a single heated block 416 provides a simplified and cost effective design. However, the heated block 416 cannot be easily rotated to rotate the wafers during processing. Wafer rotation is often desired to enhance uniformity in semiconductor processing. In alternative embodiments, a separate rotating heating plate may be provided for each wafer 406 to further enhance uniformity. The wafers 406 could also be held slightly above the heated plate 416 and rotated on pins 410. However, the chamber according to the first embodiment provides excellent uniformity without rotation, so a simplified and cost effective design is preferred.

The heated block 416 is heated by a resistive heater 420 positioned below the heated block 416. The resistive heater 420 preferably comprises silicon carbide coated graphite although other materials may also be used. Heater support pins 422 space the resistive heater 420 from heated block 416 by a short distance (approximately 0.125 of an inch). A power source (not shown) is connected to the resistive heater 420 by a heater mounting mechanism 424 in a separate heater mounting chamber 442. Current is driven through resistive heater 420 to heat the heated block 416 which in turn acts as a stable heat source for wafer 406. The power applied to the resistive heater may be adjusted to control the temperature of the heated block. A thermocouple 426 or other temperature sensor may be used to measure the temperature of the heated block 416. An optical pyrometer or thermocouple (not shown) may also be used to measure the wafer temperature directly. The temperature sensors send signals indicative of the temperature of the heated block 416 and/or wafer 406 to a conventional temperature control system (not shown). The temperature control system then causes a transformer or other power source to apply an appropriate amount of power to the resistive heater 420 to achieve the desired processing temperature. Typically temperatures between five hundred degrees Celsius (500° C.) and one thousand degrees Celsius (1000° C.) are used for thermal processing in the chamber according to the first embodiment.

Other mechanisms may be used to provide a stable heat source. For instance, an RF coil could be used to induce a current in a conductive plate within the chamber or lamps could be used to heat the backside of a conductive block.

In one embodiment, the stable heat source may be provided by a grid of heating elements (resistive wires). The grid may be used to heat the block 416 or may be a replacement for the block 416. The latter case is illustrated in the embodiment 400' of the tool shown in FIG. 4B where the grid of heating elements is indicated by reference number 450. In use the wafer 406 will make direct contact with the grid 450.

In order to reduce heat loss and enhance uniformity, heated block 416 and wafer 406 are enclosed within an insulated heating chamber 428. Heating chamber 428 is formed by insulating walls 430a-d spaced apart from heater 420, heated block 416 and wafer 406. The insulating walls 430a-d may comprise a material that has a low thermal conductivity. In addition, insulating walls 430a-d are preferably highly reflective and substantially non-transmissive to thermal radiation (particularly in the visible and infrared regions). Thus, insulating walls 430a-d substantially prevent heat transfer by direct radiation from within heating chamber 428 to cold chamber walls 402. In the first embodiment, insulating walls 430a-d comprise opaque quartz with a thermal conductivity of approximately three and one half Watts per centimeter Kelvin (3.5 W/cmK). Opaque quartz is highly preferred in the first embodiment because it is durable and inert in virtually all processes, has a high reflectivity and low conductivity, and may be used to form an insulating wall using a single intrinsic piece of material. Opaque Silica Glass OP-1 from Nippon Silica Glass U.S.A., Inc. is an exemplary opaque quartz that may be used in one embodiment. In contrast to transparent quartz, opaque quartz is white with a nearly ideal opaque appearance. This is due to the special structure of the material which has a well-controlled distribution of micropores in the otherwise dense matrix, scattering light and thermal radiation in a very efficient and homogeneous way. Thus, the direct transmission of radiation is nearly completely suppressed (less than 1% transmission across wavelengths from 200 to 5000 nm for 3 mm path length). The surface of the opaque quartz is preferably treated to inhibit flaking and the release of particulates. This is accomplished in the first embodiment by exposing the surfaces of the opaque quartz to high temperatures which glaze the surfaces. This forms a shallow layer (approximately 1 mm deep) of clear durable quartz on the exterior surfaces of the insulating walls which acts as a protective coating.

Other heat resistant insulating materials, such as alumina and silicon carbide, could be used for the insulating walls. In addition, the insulating walls may be formed from a transmissive material such as clear quartz coated with a reflective material such as alumina, silicon carbide, or silicon nitride. However, these alternatives tend to be less durable than glazed opaque quartz, often flake and spall, and may interfere with the chemistry of some processes.

The material used for the insulating walls may have a thermal conductivity less than five Watts per centimeter Kelvin (5 W/cmK) in the first embodiment although it will be readily understood that the thickness, thermal conductivity, and transmission of the material may be varied to achieve a desired level of insulation. Additional insulating walls may also be positioned between the heating chamber 428 and chamber walls 402 to improve insulation. In particular, the heating chamber 428 may be enclosed within multiple insulating housings with vacuum regions formed between the housings.

Figure 4A:
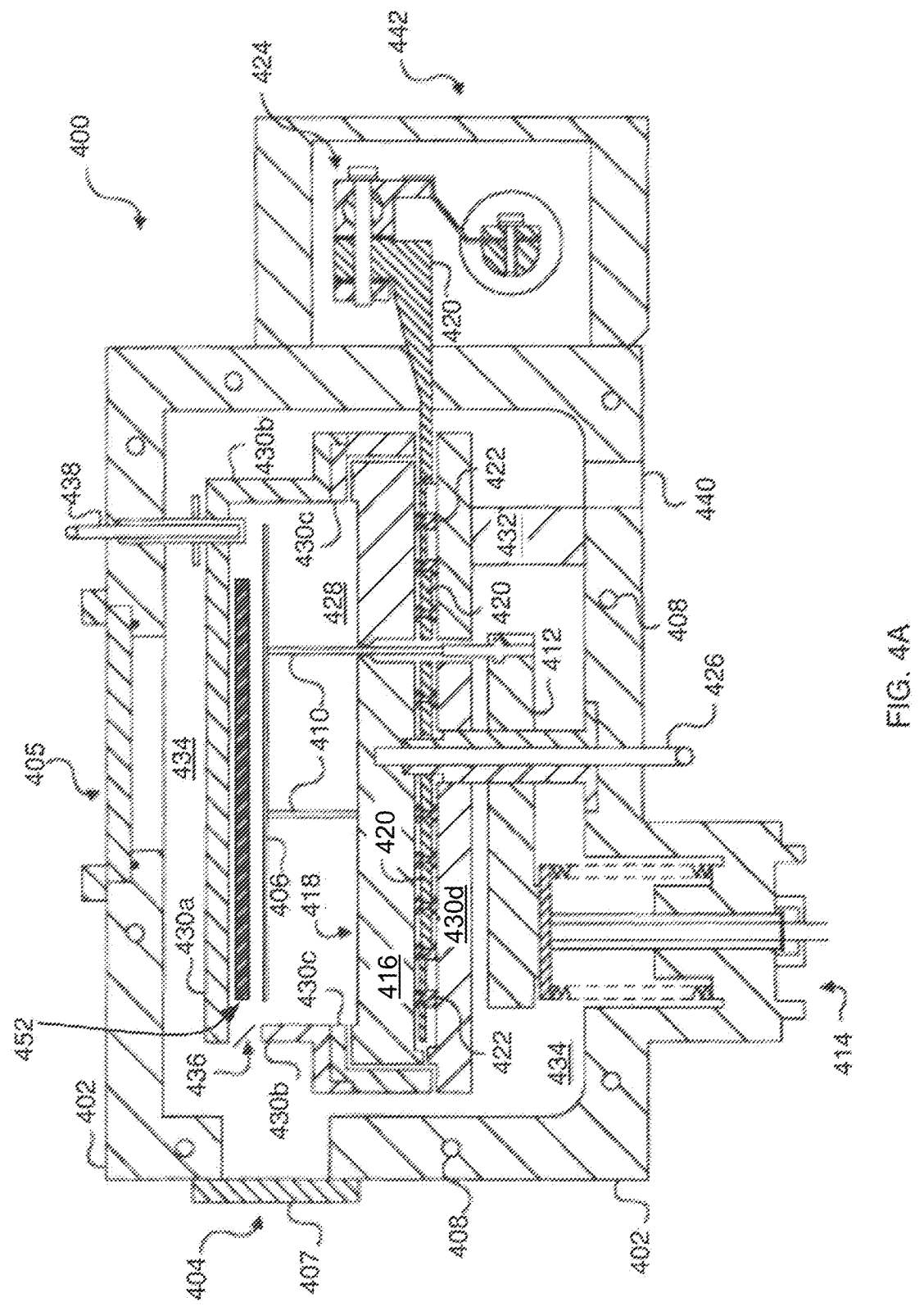
Figure 4B:
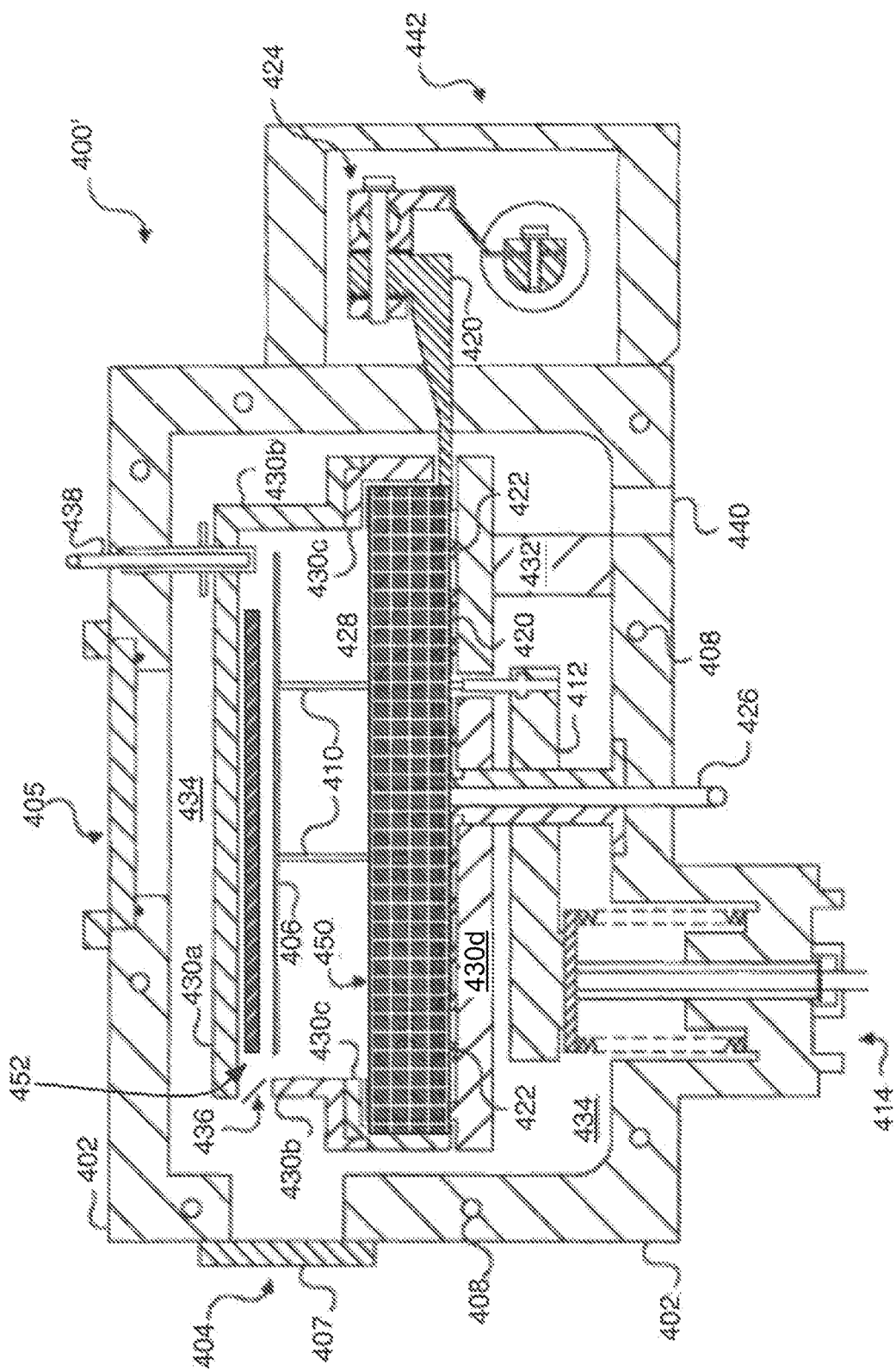
Figure 6:
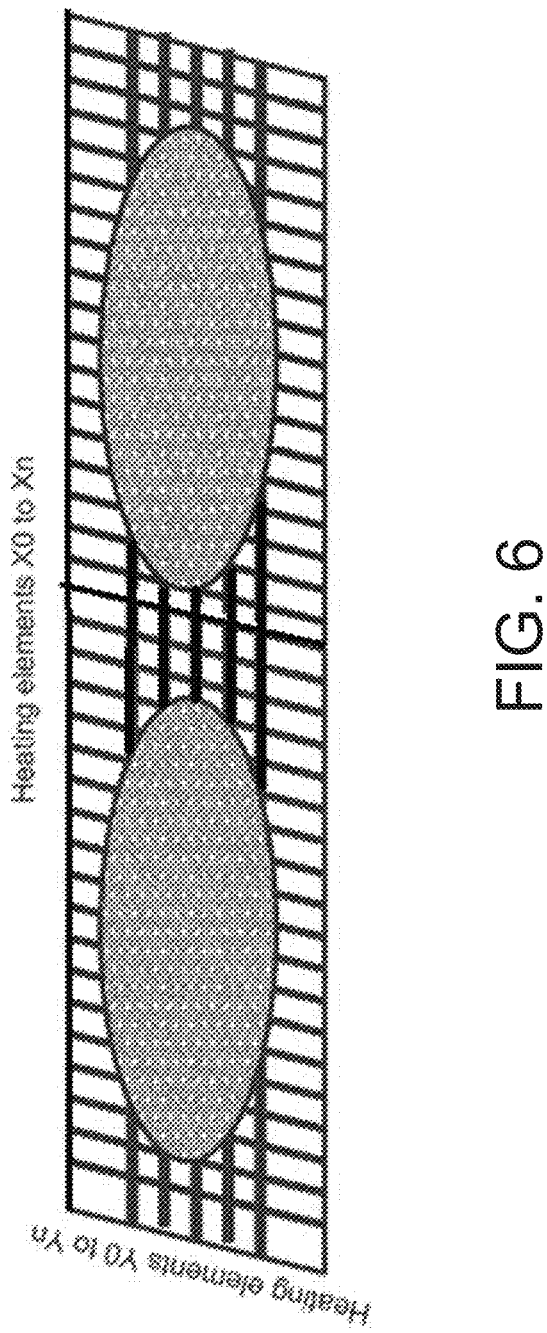
FIG. 6 shows the heating grid with two wafers in a single line.

As shown in FIGS. 4A and 4B, four opaque quartz insulating walls—a top 430a, side 430b, base 430c, and bottom 430d—are used to form heating chamber 428 in the first embodiment. The top 430a and side 430b insulating walls may be formed from a single piece of opaque quartz which provides an insulating hood that may be placed over each wafer processing station. As shown in FIG. 4A, the base 430c and bottom 430d insulating walls are closely spaced to the heated block 416 and resistive heater 420. In the first embodiment, the base 430c and bottom 430d insulating walls substantially encapsulate the heat source except for exposed circular regions of the heating surface which are shaped to receive the wafers. This helps channel the heat flux from the heat source through a circular region normal to the wafer surface and reduces lateral thermal gradients. In addition, the heating surface extends radially from the circular region underneath the base insulating wall 430c. This helps isolate the wafer 406 from any temperature drop off at the edge of the heated block 416. As shown in FIG. 4A, the heated block 416 forms shallow pockets for receiving the wafers 406 in the circular regions that are left exposed by the base insulating wall 430c. The pockets are between one sixteenth (0.0625) and one eighth (0.125) of an inch deep in the first embodiment and may be flat, slightly concave with the center of the pocket being slightly lower (approximately 0.003 inches) than the perimeter of the pocket, or stepped with the center recessed relative to a ledge formed about the outer radius of the pocket. Recessed pockets help retain heat at the edges of the wafer and the pocket shape may affect temperature uniformity across the wafer surface. Nevertheless, outstanding process uniformities have been achieved at six hundred degrees Celsius (600° C.) and eight hundred degrees Celsius (800° C.) using both flat and recessed pocket designs.

The insulating walls 430a-d substantially enclose the heating chamber 428 and form an outer insulating chamber 434 between the insulating walls 430a-d and the cold chamber walls 402. The insulating walls 430a-d form an inner port 436 between the heating chamber 428 and insulating chamber 434 to allow a wafer to be inserted into the heating chamber 428. A piece of insulating material may be used to cover the inner port 436 during processing to provide additional insulation. Generally, heat is transferred in the first embodiment from the heated plate 416, across the heating chamber 428 to the insulating walls 430a-d, through the insulating walls 430a-d and across the insulating chamber 434 to the cold chamber walls 402. Of course, some heat may be transferred through support leg 432 by conduction and through inner port 436 by direct radiation (unless an opaque cover is used). However, a substantial majority (more than 90%) of the radiation from the heated block 416 is intercepted by the insulating walls 430a-d and only a small portion of the bottom insulating wall (less than 10%) is in contact with the support leg 432. Thus, the rate of heat transfer in the first embodiment is substantially dependent upon the thermal resistance across the heating chamber 428, through the insulating walls 430a-d, and across the insulating chamber 434.

The thermal resistance across the heating chamber and insulating chamber can be adjusted by adjusting the processing pressure. Tube 438 provides a gas inlet and gas exhaust port 440 provides a gas outlet. The tube 438 is connected to a conventional gas source (not shown) and gas exhaust port 440 is connected to a conventional vacuum pump (not shown) which allows the pressure in the chamber to be controlled. In the first embodiment, pressures from seven hundred sixty (760) Torr (atmospheric) down to less than one tenth (0.1) of a Torr may be achieved. As will be described further below, pressures less than one hundred (100) Torr, and in particular pressures between two (2) Torr and fifty (50) Torr, are preferred in the first embodiment.

The low pressure, insulating walls, and other thermal properties (described further below) allow a very compact chamber design to be used with a high level of uniformity. In the first embodiment, the heated block 416 is approximately ten (10) inches wide which is only slightly wider than the wafer 406 and its edges may be within one (1) inch of the cold chamber walls 402. The base insulating wall 430c is approximately one hundred twenty five thousandths (0.125) of an inch from the edge of heated block 416 and the distance from the base insulating wall to the chamber wall (across the insulating chamber 434) is less than half an inch. Thus, the width of the heated block 416 is more than eighty percent (80%) of the interior width of the processing chamber. In addition, the heated block 416 occupies more than ten percent (10%) of the interior volume of the processing chamber.

The tool also includes a magnetic field generator in form of a plurality of elongate current carrying conductors 452 disposed within the chamber 428.

Referring now to FIG. 5A of the drawings, the heating grid 450 of FIG. 4B is shown in greater detail. As will be seen, the grid 450 comprises resistive wires $Y_0$ to $Y_n$ disposed in a first direction and intersecting resistive wires $X_0$ to $X_n$ disposed in a second direction. The wafer 406 with the magnetic stack to be annealed is placed on the grid 450 as is illustrated in FIG. 5B. FIG. 5C shows the elongate current carrying conductors $Z_0$ to $Z_n$ that are used to create the magnetic field during the magnetic annealing process. The conductors $Z_0$ to $Z_n$ overlie the wafer 406 so that the wafer 406 is sandwiched between the heating grid 450 and the conductors $Z_0$ to $Z_n$.

Thus, it is to be appreciated that embodiments of the invention have disclosed a three tiered approach to annealing in which at a first tier heat is supplied to a wafer 406 held at a second tier on a substrate, and a magnetic field is applied to the wafer 406 through energizing of current carrying conductors located at a third tier.

Figure 1:
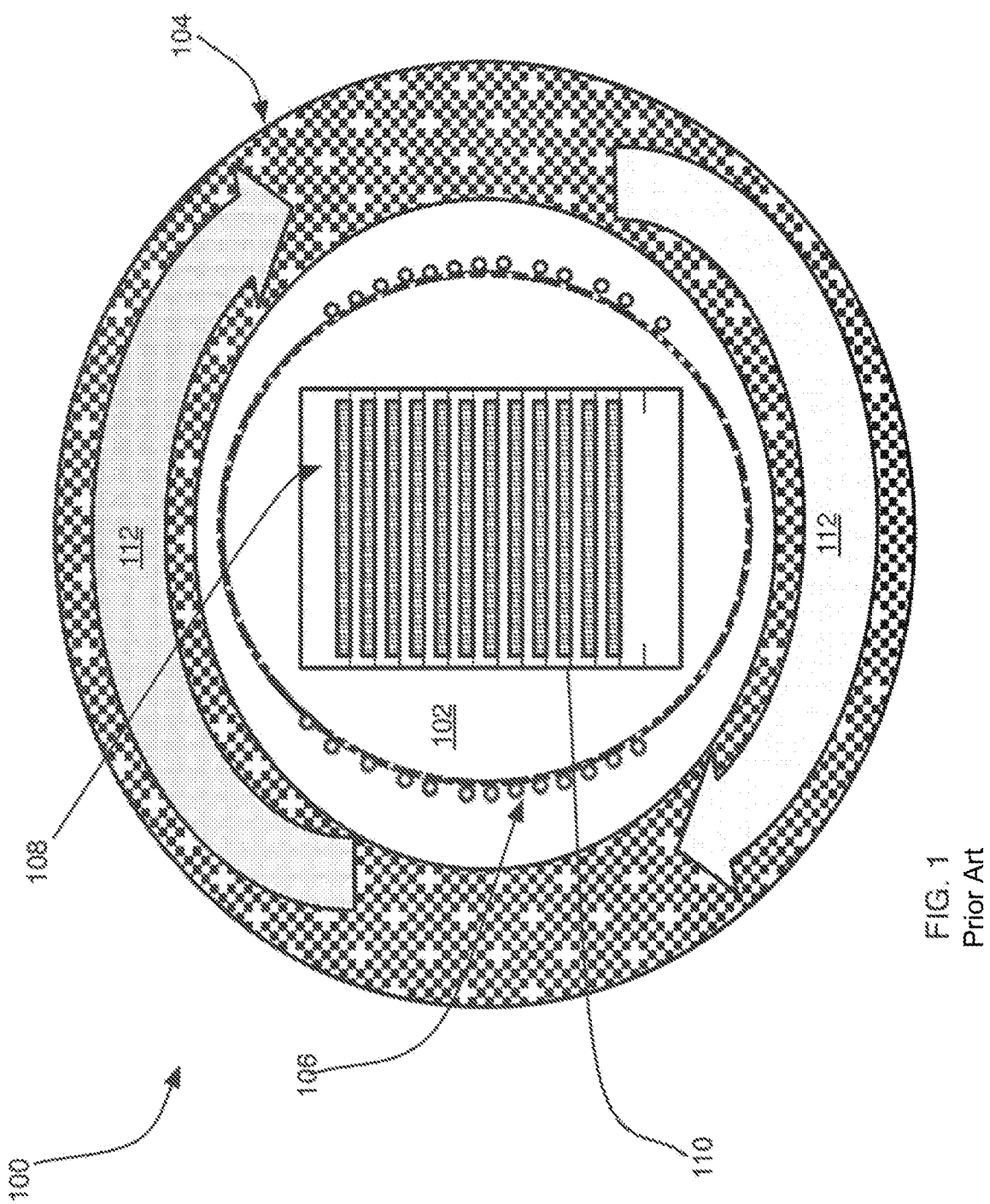
FIG. 1 shows a schematic drawing of thermal processor, in accordance with the prior art.
Figure 2:
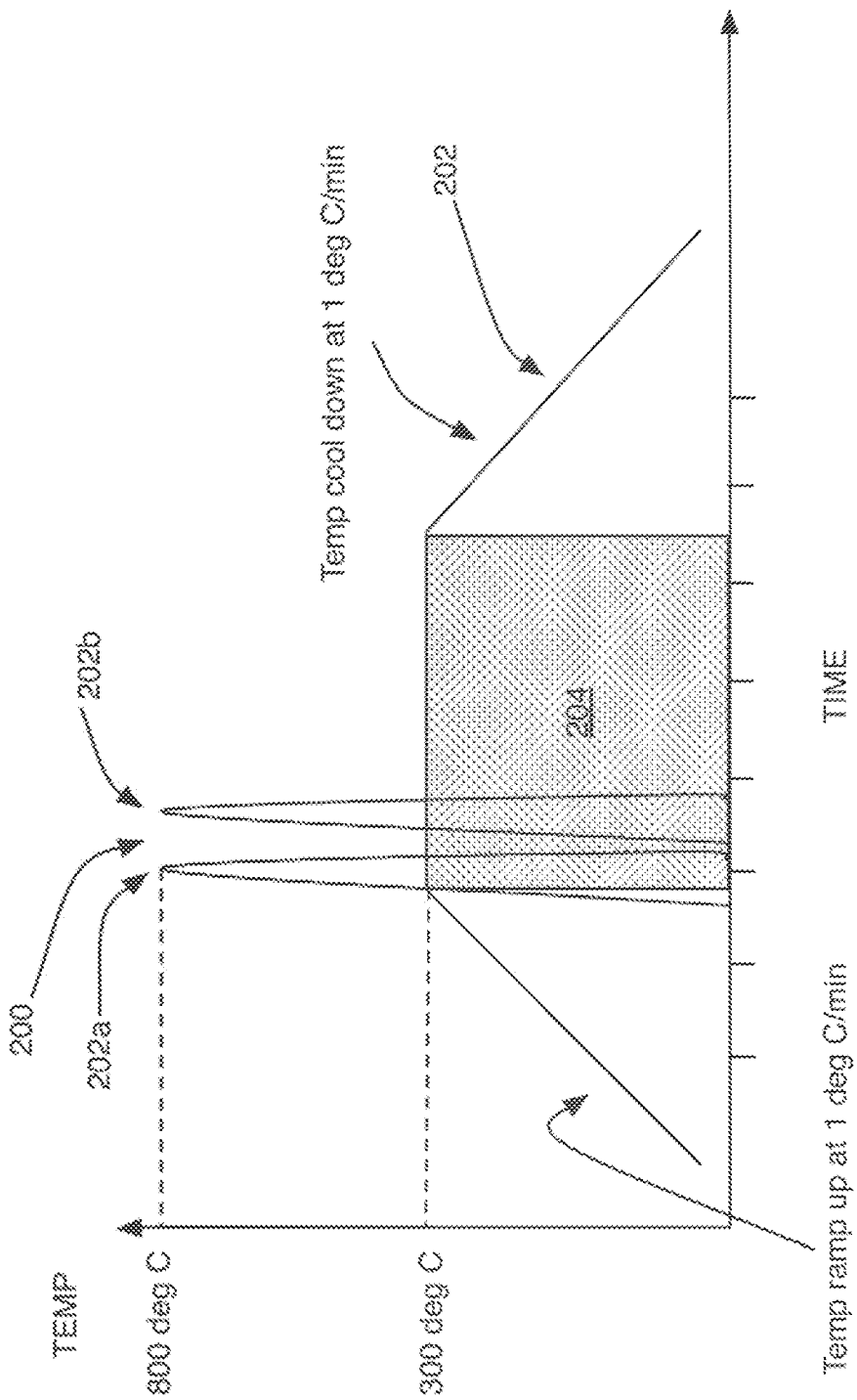
FIG. 2 shows a temperature profile for a rapid thermal annealing process, in accordance with one embodiment of the invention.

FIG. 2 shows a temperature profile 200 for an annealing process performed with the annealing tools disclosed herein. Also shown in FIG. 2 and indicated by reference numeral 202, is the temperature profile for a conventional process for annealing of a magnetic stack. It will be appreciated that the profile 200 indicated a much higher temperature peak and a much shorter duration when compared with the profile 202. The thermal energy delivered by the profile 202 is by the shaded portion indicated by reference numeral 204. The equivalent of this thermal energy may be delivered as a single pulse 202a, or a series of additional pulses (only one additional pulse 202b is shown) in the profile 200. Beneficially, the shorter times and higher peak temperature of the profile 200 mitigate the problems of material diffusion and junction breakdown associated with conventional annealing processes for magnetic stacks. Further, with the tools disclosed herein thermal and magnetic annealing can occur at the same time, thus improving the number wafers that can be processed over time.

The tools and method disclosed herein may be used to:
1. Achieve perfect to near-perfect crystalline structures of materials such as PtMn(Platinum Manganese), IrMn (Iridium Manganese), MgO (Mangesium Oxide).
2. Achieve the best device performance characteristics such as MR (Magneto Resistance) ratio, RA (Resistance Area product), tunnel junction dielectric breakdown.
3. Increase the throughout (number of wafers annealed per hour) by cutting down the annealing time by annealing at higher temperature to supply adequate thermal energy in a shorter time.
4. Reduce the cost of the equipment by adopting single wafer processing that requires less complex less expensive annealing equipment.
5. To simplify annealing equipment design and size by applying a heat cycle followed by the application of a magnetic field cycle.
6. To achieve film and crystallographic uniformity by localized temperature control and adjustment.

In one embodiment, preexisting semiconductor equipment may be retrofitted with a magnetic field generator to realize the tool disclosed herein.

Although the present invention has been described with reference to specific exemplary embodiments, it will be evident that the various modification and changes can be made to these embodiments without departing from the broader spirit of the invention. Accordingly, the specification and drawings are to be regarded in an illustrative sense rather than in a restrictive sense.

What is claimed is:

1. A tool for annealing a magnetic stack of a wafer, the tool comprising:
   a magnetic field generator positioned above an upper major surface of the wafer, the magnetic field generator comprising a plurality of conductors that traverse the upper major surface of the wafer, and the plurality of conductors being configured to generate a magnetic field comprising a plurality of magnetic field lines that align a magnetic domain in the wafer with the upper major surface of the wafer,
   wherein the magnetic domain in the wafer is aligned in a parallel direction with the upper major surface of the wafer.

2. The tool of claim 1, wherein the plurality of conductors comprise a plurality of elongated, parallel, current-carrying conductors.

3. The tool of claim 1, further comprising:
   a chamber; and
   a support configured to engage a lower major surface of the wafer and position the wafer within the chamber.

4. The tool of claim 3, wherein the support is configured to position the lower major surface of the wafer in contact with a heating grid.

5. The tool of claim 3, wherein the support is configured to position the lower major surface of the wafer in contact with a heated block.

6. The tool of claim 1, further comprising:
   a heating grid comprising a plurality of resistive conductors.

7. The tool of claim 6, wherein the plurality of resistive conductors comprises at least one first resistive conductor disposed in a first direction and at least one second resistive conductor disposed in a second direction and intersecting the at least one first resistive conductor.

8. The tool of claim 6, wherein the heating grid is configured to supply heat directly to the wafer.

9. The tool of claim 1, further comprising:
a heated block configured to transfer heat to the wafer from a heating grid.

10. The tool of claim 9, wherein the heated block has a greater thermal mass than the wafer.

11. The tool of claim 1, further comprising:
a plurality of pins configured to engage a lower major surface of the wafer; and
a lift configured to lower the plurality of pins to adjust a distance between the lower major surface of the wafer and a heating element.

12. The tool of claim 11, wherein the plurality of pins extend through the heating element.

* * * * *